(12) United States Patent
Jackson et al.

(10) Patent No.: US 7,468,871 B2
(45) Date of Patent: Dec. 23, 2008

(54) RESIDUAL CURRENT DEVICES

(75) Inventors: Jonathan Keith Jackson, Bangor (GB); Andrew Williams, Conwy (GB)

(73) Assignee: Eaton Electric Limited (GB)

( * ) Notice: Subject to any disclaimer, the term of this patent is extended or adjusted under 35 U.S.C. 154(b) by 345 days.

(21) Appl. No.: 10/535,870

(22) PCT Filed: Nov. 10, 2003

(86) PCT No.: PCT/GB03/04833

§ 371 (c)(1),
(2), (4) Date: Dec. 19, 2005

(87) PCT Pub. No.: WO2004/042882

PCT Pub. Date: May 21, 2004

(65) Prior Publication Data

US 2006/0158798 A1 Jul. 20, 2006

(30) Foreign Application Priority Data

Nov. 8, 2002 (GB) ............................. 0226111.3

(51) Int. Cl.
*H02H 3/00* (2006.01)

(52) U.S. Cl. .................. 361/42; 324/509; 324/523; 324/528

(58) Field of Classification Search ............ 361/42–50; 324/127, 424, 508–509, 522–523, 527–528
See application file for complete search history.

(56) References Cited

U.S. PATENT DOCUMENTS

| | | | | |
|---|---|---|---|---|
| 3,786,356 A | * | 1/1974 | MacPhee | 361/45 |
| 4,685,024 A | * | 8/1987 | Martellock et al. | 361/93.6 |
| 4,833,564 A | * | 5/1989 | Pardue et al. | 361/93.6 |
| 5,459,630 A | * | 10/1995 | MacKenzie et al. | 361/45 |
| 5,652,511 A | * | 7/1997 | Pearse et al. | 324/240 |
| 5,978,191 A | * | 11/1999 | Bonniau et al. | 361/45 |
| 5,982,593 A | * | 11/1999 | Kimblin et al. | 361/42 |
| 6,002,565 A | | 12/1999 | Ronisch | |
| 6,160,697 A | * | 12/2000 | Edel | 361/143 |
| 6,426,632 B1 | * | 7/2002 | Clunn | 324/509 |

(Continued)

FOREIGN PATENT DOCUMENTS

CN 1319927 10/2001

(Continued)

*Primary Examiner*—Stephen W Jackson
*Assistant Examiner*—Terrance R Willoughby
(74) *Attorney, Agent, or Firm*—Kirk D. Houser; Eckert Seamans Cherin & Mellott, LLC (57) ABSTRACT

A residual current device (RCD) protects a circuit by tripping in response to an imbalance signal representative of residual current imbalance in the circuit. The RCD trips the circuit when the imbalance signal exceeds a predetermined threshold rating. The RCD includes a sense coil for generating the imbalance signal and a test coil for introducing a simulation residual current imbalance into the device so as to increase the imbalance signal. A processor monitors the imbalance signal and determines the simulation residual current imbalance required to increase the imbalance signal to a level that corresponds to the predetermined threshold rating so that the sense coil senses the sum of any residual current imbalance in the circuit being protected and the simulation residual current imbalance in order to test operation of the RCD against the predetermined threshold rating.

14 Claims, 4 Drawing Sheets

U.S. PATENT DOCUMENTS 6,807,035 B1 * 10/2004 Baldwin et al. ............... 361/42
7,221,548 B2 * 5/2007 Bauer ......................... 361/42

FOREIGN PATENT DOCUMENTS

| | | |
|---|---|---|
| EP | 0 368 030 A1 | 5/1990 |
| GB | 2 203 907 A | 10/1988 |
| JP | 59107270 * | 6/1987 |
| WO | WO 95/26586 | 10/1995 |
| WO | WO 02/054557 A1 | 7/2002 |

* cited by examiner

FIG 1

Prior Art

FIG 2

Prior Art

FIG 3

Prior Art

Sinusoids added in phase

- - - - - Induced test residual
——— Standing residual
——— Resultant

FIG 6

Sinusoids added at 90 degrees

- - - - - Induced test residual
——— Standing residual
——— Resultant

FIG 7

Adddition of 50Hz standing residual and 40Hz test signal

— Standing residual (20mA RMS)
— Resultant (30mA RMS)
---- Test current (22.4mA RMS)

FIG 8

Deguassing waveform

RESIDUAL CURRENT DEVICES

The present invention relates to residual current devices (RCDs). More specifically, it relates to RCDs that have a test facility which, when actuated, causes the device to trip.

Figure 1:
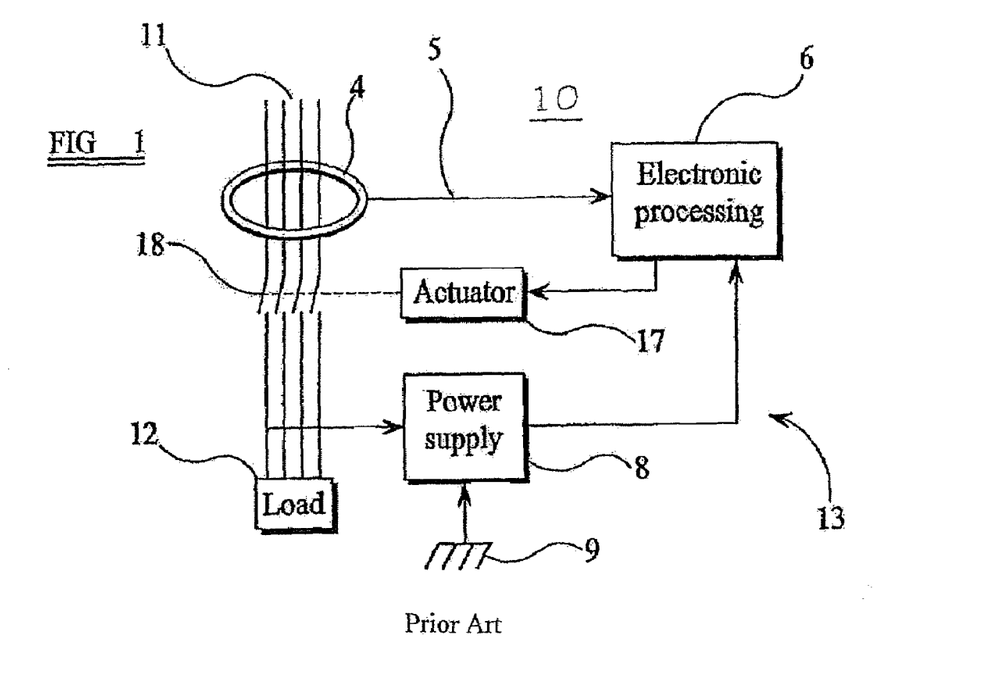
FIG. 1 is a schematic circuit diagram of a known electrical installation having a known RCD, as hereinbefore described.

RCDs are installed for protection against certain potentially dangerous situations arising in electrical supply installations. As shown in FIG. 1, an electrical supply installation 10 has a number of conductors 11 (typically neutral and live conductors for single phase A.C. supplies and three live conductors or three live and one neutral conductor for three phase A.C. supplies). The conductors 11 connect to a load circuit 12 (e.g. a domestic ring main to which appliances are connected). A known RCD 13 operates by disconnecting the supply from the load circuit 12 when an imbalance is detected in the current flowing in the conductors 11. This imbalance is due to current flowing to earth indicating, for example, poor insulation or electrocution of a person.

The RCD 13 has a current transformer 4 consisting of a toroidal magnetic core surrounding the conductors 11. A sensor coil (not shown) is wound around the core so that any imbalance in the current flowing in the conductors 11 causes a sensor signal current 5 to be induced in the sensor coil, which current is proportional to the current imbalance. An electronic signal processing circuit 6 analyses the sensor signal current 5 to determine if the current imbalance is at or above a pre-set trip threshold indicative of a potentially dangerous condition in the supply circuit. The device then trips the circuit by providing power to an actuator 17 to actuate a switch 18 to isolate the supply from the load circuit 12.

RCD devices are required to be fitted with a test button. Pressing the button causes the device to trip, which allows a person to test satisfactory operation of the device. Activation of the test button closes a contact causing a test circuit to introduce a signal to simulate a residual current so that the whole signal path from the sensor to the switch is included in the test. This may be achieved by the circuit shown in FIG. 2. Some of the current in one of the conductors 21a of live and neutral supply conductors 21a, 21b flows via a resistor 22 so as to bypass the current transformer 4 when a test button is pressed to close a contact 24. There are many disadvantages with this approach. Firstly, connection of the test circuit to the mains conductors 21a, 21b is required, which can be mechanically awkward within RCD devices. Secondly, the apparent residual current produced is voltage dependent and also dependent on the tolerance and stability of the resistor 22. In practice, currents much greater than the trip threshold are induced so as to ensure tripping (typically two and a half times, and in some cases as much as five times, the rated trip value). This tests that the device will operate, but not that it will necessarily operate at the rated trip value. Thirdly, no account is taken of any standing residual current already in the circuit. In the test, the device simply adds the test residual current to any standing residual current already present. Again this means that the test is not carried out at the rated trip value.

Figure 2:
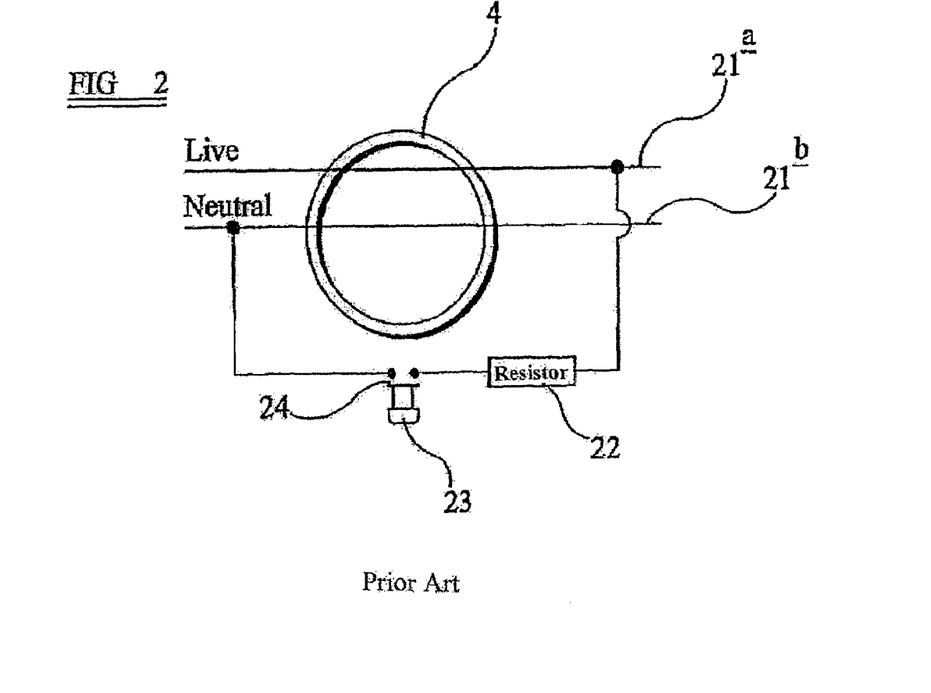
FIG. 2 is a schematic circuit diagram of a known test circuit for an RCD, as hereinbefore described.

The following further problems may also arise. If the device fails to trip for any reason when the button is pressed, and the button is held down, the resistor 22 can quickly become very hot and burn. The device may be subjected to voltage variations in the supply. As well as affecting the accuracy of the test, high voltage pulses that may occur between the live and neutral conductors 21a, 21b can give rise to arcing at the contact 24. RCDs are made with different trip threshold ratings and so the resistor 22 must be changed to suit the threshold, which is inconvenient for production.

Figure 3:
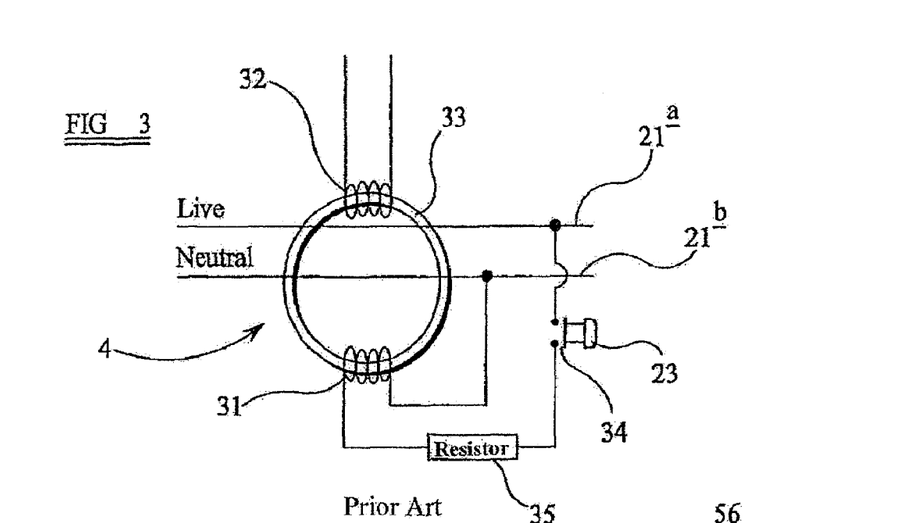
FIG. 3 is a schematic circuit diagram of another known test circuit for an RCD, as hereinbefore described.

Another known method of implementing the test function is shown in FIG. 3. A magnetic field is introduced into a core 33 of the current transformer 4. A second winding 31 is provided on the transformer core 33. The winding is placed in series with a resistor 35 in a test circuit between the live conductor 21a and neutral conductor 21b. When the test button 23 is pressed a contact 34 closes the circuit and a test signal current flows through the second winding 31. This will induce a current in the sense coil 32. Typically the test signal current is much smaller than the sensor signal current required to trip the device due to current gain in the transformer 4. A 100 turn winding means only $\frac{1}{100}^{th}$ of the trip threshold current is required to produce an apparent residual current sufficient to cause a trip. This method reduces the problem of resistor heating, but does not overcome most of the disadvantages of the previous method, such as supply voltage connection, inaccuracy due to standing residual current, high voltage contact rating and resistor tolerance and stability.

Another problem associated with current transformers is that of remanence. This is an effect where the magnetic material forming the core of the transformer becomes magnetized. This effectively lowers its permeability and prevents it from conveying further magnetic flux. The coupling effect of the transformer is then effectively lost or reduced and the device becomes insensitive. Magnetisation can occur when heavy fault currents flow and are switched off when at peak value by the tripping mechanism leaving remanent magnetisation. When this has occurred and the device is subsequently reset, insensitivity due to remanence means that the device may be reset when a fault is still present in the supply circuit.

It is an aim of the present invention to provide an RCD which substantially alleviates these problems.

According to a first aspect of the present invention there is provided a residual current device (RCD) intended for tripping an electrical supply from a circuit to be protected when a residual current imbalance in the circuit exceeds a predetermined threshold rating, the RCD comprising:

sense means for generating an imbalance signal representative of residual current imbalance in the circuit;

trip means intended for tripping the residual current device when the imbalance signal exceeds the predetermined threshold rating so as to disconnect the electrical supply from the circuit; and test means for increasing the imbalance signal to a level which substantially corresponds to the predetermined threshold rating whereby a trip at said rating indicates a successful test.

It is an advantage that the device may be tested for whether or not the RCD trips at or near the rated value. That is, a successful test indicates that the device is operative to trip at the intended threshold rating. An unsuccessful test is one where the device trips when the imbalance signal is below or above the threshold, this condition indicating that the device is not operating at its rating. The test is therefore more rigorous and accurate than the test provided in prior art devices.

The sense means may be operative for measuring an amount of any residual current imbalance in the circuit.

The test means may be operative for calculating a difference value corresponding to the difference between the measured residual current imbalance and the predetermined threshold rating. The difference value may be applied such that the increase in the imbalance signal is substantially instantaneous. Alternatively, the testing means may be operative to ramp up or progressively increase the imbalance signal from a low or zero value to the predetermined threshold value. This alternative provides for determining the level of current imbalance at whichever level the device trips. This advantageously provides for testing whether the device trips at a level which is less than the predetermined threshold.

In embodiments of the invention, the test means effectively introduces a simulation residual current imbalance into the device so that the sense means senses the sum of any residual current imbalance in the circuit being protected and the simulated residual current.

In a preferred embodiment, the sensor means comprises a current transformer having a sense coil, the imbalance signal being an imbalance sense current induced in the sense coil. The means for increasing the imbalance signal may include a test coil, wherein a test current applied to the test coil is operable for introducing the simulation current imbalance in the form of a magnetic field in the transformer, thereby inducing the increase in the imbalance sense current in the sense coil.

The testing means may be coupled to a processor that monitors the imbalance signal and determines the simulation current imbalance required to increase the imbalance signal to a level that corresponds to the rated value. It is an advantage that, if the processor detects a current imbalance below the rated trip value (a standing current imbalance), then it determines how much to increase the imbalance signal to reach the level that corresponds to the rated trip value, and thereby provides a more accurate test than the prior art devices.

The processor may include an analogue to digital converter (ADC) for converting the current imbalance signal to a digital form, a micro-controller unit (MCU) for processing the digital signal and for providing a digital output signal, and a digital to analogue converter (DAC) for converting the digital output signal to an analogue test signal. The digital processing enables the generation of a test current having a waveform and phase profile appropriate for providing the required sum.

An advantage of synthesising a waveform for the simulation current imbalance directly from the processor is that it is independent of the electrical supply and any variations therein. A further advantage is that the waveform can be synthesised by the processor based on the standing residual current determined from the imbalance signal. This means that whatever waveform, phase angle or frequency the standing residual current has, the processor can synthesise a simulation current imbalance waveform, which, when added to the standing residual current waveform, ensures that the device is tested against the rated value.

Preferably, the processor is an integrated circuit in the RCD. An integrated circuit is an effective, low cost, space-efficient processor, which is simple to assemble into an RCD.

According to a second aspect of the present invention there is provided a residual current device (RCD) comprising:

a current transformer for generating an imbalance sense current in a sense coil in response to a current imbalance in an electrical supply; and a degaussing coil for substantially removing remanence in the current transformer by application of a degaussing signal to the degaussing coil.

The degaussing coil may be combined with a test coil forming part of a testing means in a device according to the first aspect of the present invention as defined above.

Degaussing is a method of removing a remanent magnetic field by driving the transformer core with an alternating field which decreases in amplitude over several cycles. Removing remanence means that a device, which has been desensitised due to a remanent magnetic field in the transformer core, can be resensitised and thereby re-establish the device's sensitivity so that it will continue to function in the required manner. By degaussing to remove remanence, the device can be re-set after a trip while ensuring that the device will trip again within a very short time if the circuit still has a fault.

The degaussing signal may be applied to the degaussing coil under the control of a processor. The processor may be configured to apply the decaying alternating field at a high frequency so that the degaussing signal is not detectable by the RCD's residual current detection system. This ensures that degaussing is achieved in a very short time and that remanence is removed quickly when re-setting the RCD. The RCD must be capable of tripping within a specified number of cycles of the A.C. supply and so the high frequency degaussing signal ensures that remanence is removed in fewer than the specified number of cycles. The high frequency degaussing also enables the processor to be configured to control degaussing during normal operation.

Embodiments of the invention will now be described with reference to the accompanying drawings in which.

Figure 4:
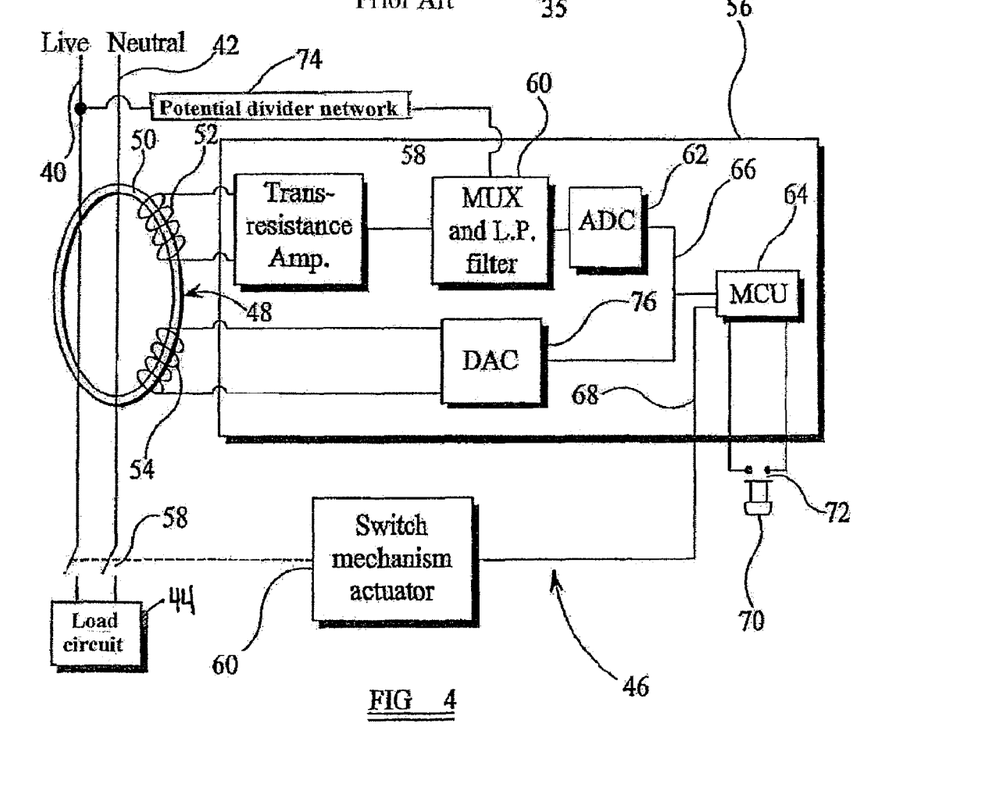
FIG. 4 is a schematic circuit diagram of a test and degaussing circuit for an RCD in accordance with the invention.

Referring to FIG. 4 a power supply installation has a live conductor 40 and a neutral conductor 42, for supplying current from a supply to a load circuit 44. An RCD 46 includes a toroidal transformer 48 having a core 50 which surrounds the live and neutral conductors 40, 42. A sense coil 52 and a test coil 54 are wound on the core 50. A current induced in the sense coil 52 is supplied as an input to an electronic processor 56. A switch mechanism 58, actuated by an actuator 60 under the control of the processor 56, breaks the live and neutral conductors 40, 42 when a predetermined level of residual current is detected.

In the electronic processor 56 the input current from the sense coil 52 flows to a transresistance amplifier 58, having a voltage output that is linearly related to the input current. The output voltage of the transresistance amplifier 58 is then fed via a lowpass filter 60 (to prevent aliasing) to an analogue-to-digital converter (ADC) 62 which outputs the voltage as a digital electronic signal. The digital signal is fed to a micro-controller unit (MCU) 64 via a digital bus 66. The MCU 64 has an output 68 for controlling operation of the switch actuator 60.

The RCD 46 is provided with a test button 70 for closing a contact 72 to initiate a test under the control of the MCU 64. A digital test signal provided by the MCU 64 is fed via the bus 66 to a digital-to-analogue converter (DAC) 76, which outputs an analogue test current to the test coil 54.

In use a current imbalance between the live and neutral conductors 40, 42, generates a magnetic field which induces a sense current in the sense coil 52. The sense current is amplified by the transresistance amplifier 58 and converted into a digital signal by the ADC 62 and read by the MCU 64. If the MCU 64 determines that the current imbalance is above the predetermined rated trip value, then a trip signal is applied to the MCU output 68 such that the switch actuator 60 actuates the switch 58 to break the live and neutral conductors 40, 42, and thereby interrupt electrical supply to the load circuit 44.

The device may be tested while operational in an untripped condition. Pressing the test button 70 closes the contact 72 and initiates the test. The MCU 64 determines the level of the current imbalance being sensed by the sense coil 52, and calculates the amount by which the current from the sense coil 52 must be increased for the RCD 46 to trip at its rated trip value. The calculated increase is provided by means of the test coil 54. A test current is provided to the test coil, which generates a magnetic field in the core 50 of the transformer 48. The magnetic field generated induces an increase in the sense current in the sense coil 52. The MCU calculates the test current required to test whether or not the RCD trips at the rated value.

The sense coil 52 is typically 1000 turns of wire and the test coil 54 is typically 100 turns. The current in the sense coil 52 is linearly related to the residual current by a factor determined by the turns ratio between the electrical circuit conductors 40, 41 (the primary coil of the transformer) and the sense coil 52. Therefore, a 10 mA RMS residual current induces a 10 micro-amp RMS current in the sense coil 52 for the 1:1000 turns ratio. A working bandwidth from 20 Hz to 2 kHz is readily achievable and adequate for RCD purposes. The transresistance amplifier 58 is characterized by having low (almost zero) input impedance which is necessary to ensure the sense current is directly related to the residual current by a fixed 1:1000 ratio over the working bandwidth. The output of such an amplifier is a voltage linearly related to the input current with a typical gain of 10000V/A.

The ADC 62 periodically samples the voltage and each time outputs a digital electronic value of typically 10 bits. The ADC 62 can be time multiplexed so as to also sample the line voltage of the supply via a potential divider network 74 allowing mains frequency to be monitored. The processor 56 measures the frequency of the residual current waveform and the sample frequency is adjusted such that a fixed number of samples per cycle are taken. A rate of 64 samples per cycle of the residual at 50 Hz gives a sample rate of 3200 Hz, whereas at 60 Hz the sample rate is 3840 Hz. An algorithm executed on the MCU 64 determines the frequency of the residual current, but in cases where it cannot be determined (e.g. the amplitude is zero, or the signal is random, or the signal is outside the expected range of values) then the line voltage frequency can be measured and used.

With the residual current waveform accurately represented by digital values, it is possible to apply digital signal processing techniques to determine various parameters of the signal and in particular to calculate its RMS value to cause a trip if this exceeds the set threshold rating. The digital processing is performed by the MCU 64, which includes control circuitry, arithmetic circuitry, a read/write memory for storage of variable values and a non-volatile read-only memory which stores an executable software program for the whole MCU 64 to follow. Other peripheral devices not shown are also present including power supplies, clock circuits and power-on reset circuits.

The calculation of the residual current RMS is performed over a whole number of cycles to ensure accuracy. Ten cycles of the residual waveform is a sufficient period to perform the calculation and since the sample frequency is adjusted to give a fixed number of samples per cycle (say 64) then the total calculation requires 640 samples. For a 50 Hz residual current frequency this therefore takes 200 mS to process 640 samples and at 60 Hz takes 167 mS. In both cases tripping occurs within the time set by published standards. The software is written into the MCU 64 at manufacture using a non-volatile memory. The non-volatile memory also contains associated configuration data, such as the tripping current threshold and calibration data derived from measurements taken at manufacture.

The DAC 76 either directly outputs current or otherwise outputs voltage which can be converted to current by a linear current-to-voltage amplifier (transconductance amplifier) or more simply using a fixed resistor. The waveshape and amplitude of the current signal produced by this system is controlled by the MCU 64 under software control.

Most prior art devices drive a current of up to 2.5 times the tripping threshold of the device using mains voltage to source a sinusoidal signal at 50 or 60 Hz. This ensures that whatever standing residual current may already be present, the test current will swamp it and guarantee the device trips. This is effective in causing a trip but does not really test the accuracy of the system. By driving a synthesized waveform into the test coil 54, the test current is independent of supply voltage and does not require a high voltage switch since the test circuit is connected to a low voltage MCU input.

However, in order for the test coil 54 to induce the correct RMS current in the sense coil 52 to produce a trip, it is necessary to determine the waveform of any standing residual current. Standing residual currents are usually caused by poor insulation or capacitive suppressor networks often found on motors. The waveform will often be a sinewave in phase with the mains voltage but it is possible that it could be up to 90 degrees out of phase if leakage is purely reactive and maybe up to 180 degrees if generating equipment is present in the load circuit. Also, non-sinusoidal residual current waveforms are common but will almost always be repetitive at the mains frequency. To illustrate this, consider a standing residual current as measured by the processor 56 to be 20 mA RMS, then the extra apparent residual current to be induced by the test circuit can be calculated using the following equation:

$$x = \sqrt{I_n^2 - s^2} \quad \text{(Equation 1)}$$

where s is the measured standing RMS residual current, $I_n$ is the RMS trip threshold and x is the required extra apparent residual RMS to be induced by the test circuit such that the resultant measured is equal to $I_n$. For a device where the threshold $I_n$ is 30 mA then it is necessary to drive the test coil to produce an extra 22.4 mA RMS measured residual to cause tripping. However, the equation above (which is based on the fact that the resultant RMS of two summed signals is equal to the root of the summed squares of the individual RMS values) assumes the following conditions a) that the standing residual and test current are of differing frequencies b) that the resultant RMS of the sum of the two signals is calculated over a long period to achieve an accurate result.

Figure 5:
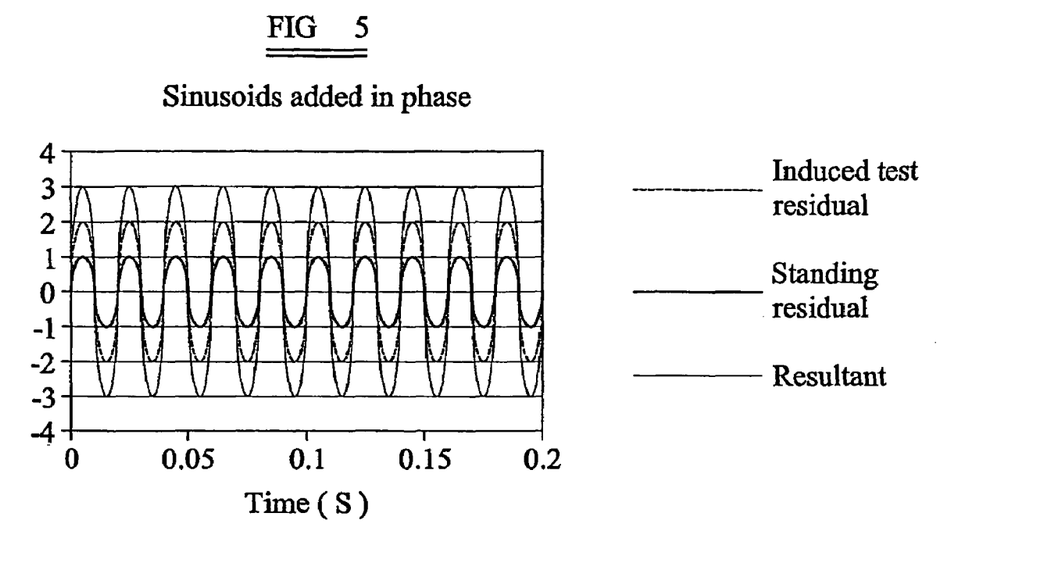
FIGS. 5, 6 and 7 are graphs showing current waveforms as may be found in an RCD according to the invention.
Figure 6:
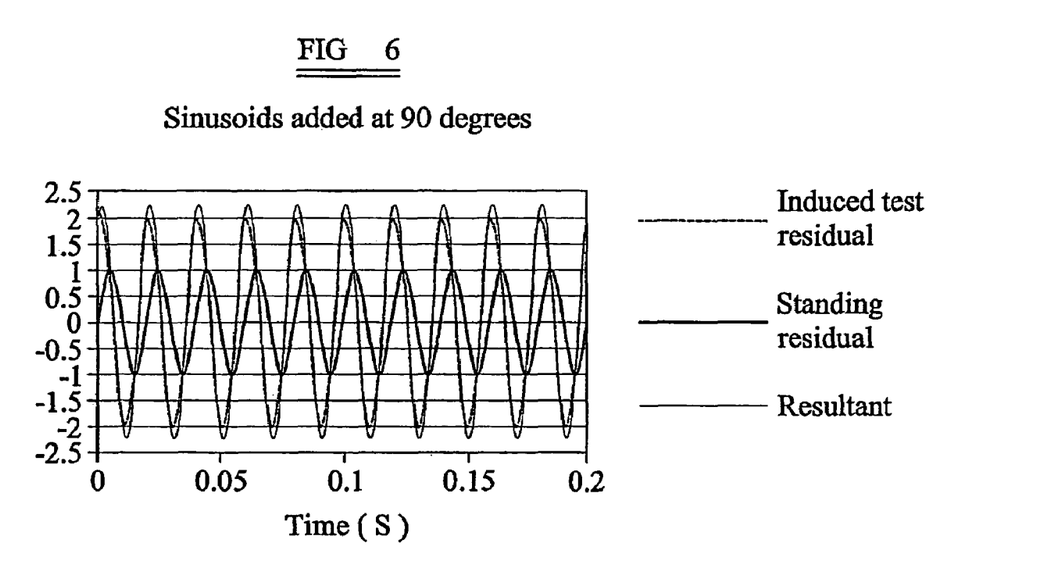

Condition "a" can be illustrated by FIG. 5 where two sinusoids of equal frequency and phase are summed, one being of a peak amplitude of 1 unit (0.7 units RMS) and the other of 2 units (1.4 RMS). The resultant according to the equation above is 1.6 RMS or 2.2 peak. However, it is clear in FIG. 5 that the resultant is of peak amplitude 3.0 and so its RMS value is 2.1. The equation actually only holds true if the two signals are 90° out of phase as shown in FIG. 6. It would be possible to measure the phase of a standing residual current and add the test current at an appropriate phase to generate the required resultant but this adds considerable complexity and does not work with all wave shapes. It is therefore evident that the RMS calculation has a dependency on the phase between the two signals being summed and an accurate result is only obtained if the RMS is averaged over all possible phase differences.

Figure 8:
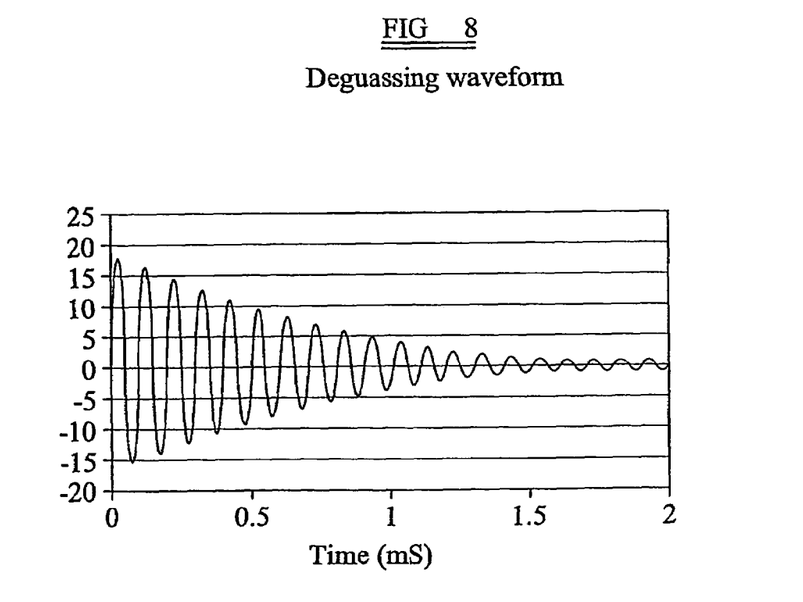
FIG. 8 is a graph showing a degaussing current waveform, for use in an RCD according to the invention.

A simpler solution is to adhere to condition "a" and drive the test signal at a different frequency to any standing residual current. As described above, the MCU 64 is capable of measuring the frequency, or in some circumstances it is assumed to be the same as the measured supply frequency. The test coil 54 can then be driven at a frequency 20% higher or lower than the measured residual current frequency (e.g. 40 Hz if the measured frequency is 50 Hz). The resultant is shown in FIG. 8. The RMS of the resultant is found to be correct as predicted by Equation 1 above, and will in fact work for any wave shape of standing residual current. It is also true that any wave shape for the test signal can also be used and the use of a square wave test signal rather than a sinusoid can be simpler to synthesise. Another way of looking at this is that the use of different frequencies means that the dependency of the resultant RMS on phase is lost because the two signals are added over time at all combinations of phase.

Figure 7:
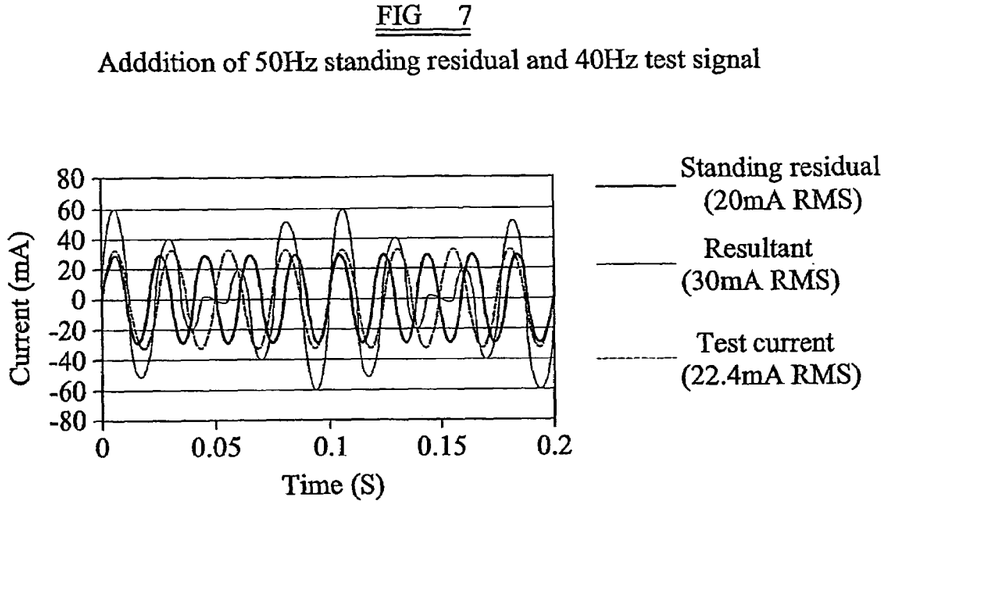

Condition "b" above, requires measurement of the resultant of the standing and induced test current signals to be performed over a great length of time to achieve accuracy. The tripping time at the rated threshold for most RCDs is set at 300 ms maximum by the relevant standards. Therefore, when the test button 70 is pressed the device has about 14 mains cycles (280 mS) to initiate the trip. This number of cycles does give reasonable accuracy but improved accuracy and tripping time can be achieved with some care. With reference to FIG. 7 it is evident that a beat frequency is present equal to the difference in the frequencies of standing residual current and test current, in this case 10 Hz for a 50 Hz residual current Over the ten-cycle period shown (200 mS at 50 Hz) two beats are present and it is notable that the relative phases of the three traces are the same at the start and end of the period shown. The result is accurate since all combinations of possible phase between the two signals have been used in the calculation exactly twice, meaning any initial phase is irrelevant and phase dependency is lost. A measurement period which is not a multiple of the beat period gives less accurate results since some phase combinations are seen more times than others and so initial phase becomes a factor in the calculated RMS of the resultant. The test signal is calculated as a fixed percentage of the standing residual current frequency such that over the period where a fixed number of samples are used to calculate the resultant RMS there will be an integer multiple of cycles of the beat frequency produced between the standing residual current and test signal frequencies.

The test current calculation must take into account the turns ratio of the sense and test coils so that the induced current ratio is correct, as well as the wave shape used for the test signal. Also, initial tolerances in the system can be accounted for using calibration values stored in memory at manufacture to modify the test current amplitude. Once the residual current frequency has been determined in the manner described above, then on initiation of a test by operation of the test button 70 a test signal of the calculated amplitude is driven into the test coil 54 at a frequency different to that of the residual current 54. The measurement system will be operating normally by continuously measuring the apparent RMS values detected in the sense coil 52 over a fixed number of mains voltage cycles and causing a trip when necessary.

Another feature of the device is the ability to effectively counter the problem of remanence described above. To counter this problem the remanent magnetic field in the transformer core 50 can be removed by driving the core 50 with an alternating field which decreases in magnitude over several cycles. This technique is called degaussing. Such a signal can be driven into the test coil 54 to permit degaussing under software control. It is particularly useful to perform degaussing at startup of the device as this is when the core 50 may have been left magnetized following a fault which caused a trip. However, periodic degaussing can be implemented during normal operation if desired, providing it can be done quickly without effecting normal operation of the device. If the degaussing signal frequency is much higher than the operating band to which the residual current sensing circuit is sensitive, then the high frequency degaussing signal will not be seen directly by the measurement system. A suitable type of waveform is shown in FIG. 8. It consists of a decaying waveform whose initial amplitude is sufficiently high to cause magnetic saturation of the core (i.e. it cannot become more strongly magnetized). The wave form has a peak amplitude of around 2A-turns of the test coil 54, so for a 100 turn test coil 54 this means a current of 20 mA peak is required. The subsequent decaying waveform leaves the core less and less magnetized after each cycle. A high frequency waveform of around 10 is suitable and a decay rate of 80% per millisecond over a two-millisecond period achieves degaussing in a short time. However, the optimum parameters of the waveform are greatly dependent upon the dimensions and material of the toroidal core. There are no extra components required to perform degaussing as the proposed components of the test circuit of FIG. 4 are able to produce the required signal. The synthesis of the waveform is undertaken by the MCU 64 under software control. The waveshape used need not be sinusoidal as suggested, other shapes such as rectangular waveforms are equally effective and are simpler to synthesize.

The invention claimed is:

1. A residual current device (RCD) for protecting a circuit by tripping in response to an imbalance signal representative of residual current imbalance in the circuit, the RCD tripping the circuit when the imbalance signal exceeds a predetermined threshold rating, wherein the residual current device (RCD) comprises:

sense means for generating said imbalance signal;

test means for introducing a simulation residual current imbalance into the device so as to increase the imbalance signal; and a processor that monitors the imbalance signal and determines the simulation residual current imbalance required to increase the imbalance signal to a level that corresponds to the predetermined threshold rating so that the sense means senses the sum of any residual current imbalance in the circuit being protected and the simulation residual current imbalance in order to test operation of the residual current device (RCD) against the predetermined threshold rating.

2. The device of claim 1, wherein the processor determines a difference value corresponding to the difference between the measured residual current imbalance and the predetermined threshold rating.

3. The device of claim 2, wherein the difference value is applied such that the increase in the imbalance signal is substantially instantaneous.

4. The device of claim 2, wherein the test mean ramps up or progressively increases the imbalance signal from a low or zero value to the predetermined threshold rating.

5. The device of claim 1, wherein the sense means comprises a current transformer having a sense coil, the imbalance signal being an imbalance sense current induced in the sense coil.

6. The device of claim 5, wherein the test means comprises a test coil, wherein a test current applied to the test coil introduces the simulation residual current imbalance in the form of a magnetic field in the current transformer, thereby inducing the increase in the imbalance sense current in the sense coil.

7. The device of claim 1, wherein the processor includes an analog to digital converter (ADC) for converting the current imbalance signal to a digital signal, a micro-controller unit (MCU) for processing the digital signal and for providing a digital output signal, and a digital to analog converter (DAC) for converting the digital output signal to an analog test signal.

8. The device of claim 7, wherein the processor is operable for generation of a test current having a waveform and phase profile appropriate for providing the required sum.

9. The device of claim 1, wherein the processor is an integrated circuit in the residual current device (RCD).

10. The device of claim 1, wherein the sense means comprises a current transformer; and wherein the test means comprises a test coil, which is further operable as a degaussing coil for removing remanence in the current transformer by application of a degaussing signal to the degaussing coil.

11. The device of claim 10, wherein the degaussing signal is applied to the degaussing coil under the control of the processor.

12. The device of claim 11 wherein the processor is configured to apply the degaussing signal so as to drive the current transformer core with an alternating magnetic field which decreases in amplitude over several cycles.

13. The device of claim 12, wherein the processor is configured to apply a decaying alternating field at a high frequency so that the degaussing signal is not detectable by the residual current device.

14. The device of claim 12, wherein the degaussing signal has a sinusoidal or a rectangular waveform.

* * * * *

UNITED STATES PATENT AND TRADEMARK OFFICE
CERTIFICATE OF CORRECTION

PATENT NO. : 7,468,871 B2
APPLICATION NO. : 10/535870
DATED : December 23, 2008
INVENTOR(S) : Jonathan Keith Jackson et al.

It is certified that error appears in the above-identified patent and that said Letters Patent is hereby corrected as shown below:

Column 7, line 35, insert a period --.-- after "current".
Column 8, line 23, "around 10 is suitable" should be --around 10KHz is suitable--.
Column 8, line 65, "test mean" should be --test means--.

Signed and Sealed this

Ninth Day of June, 2009

JOHN DOLL
*Acting Director of the United States Patent and Trademark Office*